United States Patent [19]
Buck

[11] 3,935,542
[45] *Jan. 27, 1976

[54] CONTACTLESS OSCILLATOR-TYPE PROXIMITY SENSOR WITH CONSTANT-VOLTAGE IMPEDANCE

[76] Inventor: Robert Buck, Torkelweg 4, 8990 Lindau-Enzisweiler, Germany

[ * ] Notice: The portion of the term of this patent subsequent to July 17, 1990, has been disclaimed.

[22] Filed: Jan. 22, 1973

[21] Appl. No.: 325,953

Related U.S. Application Data

[63] Continuation-in-part of Ser. No. 290,866, Sept. 21, 1972, Pat. No. 3,747,010, Continuation-in-part of Ser. No. 80,016, Oct. 12, 1970, abandoned.

[30] Foreign Application Priority Data
Jan. 22, 1972 Germany............................ 2203038

[52] U.S. Cl............. 331/65; 317/146; 317/148.5 R; 317/148.5 B; 328/5; 331/186; 340/258 C
[51] Int. Cl.²..................... H01H 36/00; H03B 5/12
[58] Field of Search.......... 331/65, 185, 186; 328/5; 340/258 C; 317/146, 148.5 R, 148.5 B

[56] References Cited
UNITED STATES PATENTS
| | | | |
|---|---|---|---|
| 3,459,961 | 8/1969 | Ravas | 328/5 X |
| 3,549,905 | 12/1970 | Johnson | 331/65 X |
| 3,742,311 | 6/1973 | Gary | 317/148.5 B X |

*Primary Examiner*—Siegfried H. Grimm
*Attorney, Agent, or Firm*—Karl F. Ross; Herbert Dubno

[57] ABSTRACT

A contactless proximity sensor includes an oscillator which generates an output damped by the presence of a metal part whose approach is to be detected. The operating voltage for the oscillator is developed across a capacitor, in parallel with a Zener diode, whose charging circuit includes a high-ohmic resistance connected in series therewith across a supply of pulsating direct current. The flow of charging current into the capacitor is controlled by a thyristor adapted to be fired by means of a trigger transistor upon a critical reduction in the amplitude of the oscillator output. The trigger transistor, upon conducting, lowers the cathode potential of the thyristor whose gate is connected, via a resistor and/or a diode, to the junction of the capacitor with its charging resistance; in one embodiment this gate is driven positive through an inverter upon the conduction of the trigger transistor. The thyristor may shunt only the charging resistance, or it may be connected in series with a second Zener diode across the voltage-generating network consisting of the first Zener diode, the capacitor and its charging resistance.

18 Claims, 6 Drawing Figures

CONTACTLESS OSCILLATOR-TYPE PROXIMITY SENSOR WITH CONSTANT-VOLTAGE IMPEDANCE

CROSS-REFERENCE TO RELATED APPLICATION

This application is a continuation-in-part of my copending application Ser. No. 290,866, now U.S. Pat. No. 3,747,010, filed 21 Sept. 1972 as a continuation-in-part of my application Ser. No. 80,016 which was filed 12 Oct. 1970 and is now abandoned.

FIELD OF THE INVENTION

My present invention relates to electronic contactless distance indicators and, more particularly, to an electronic detector for signaling the proximity of a metallic element, e.g. in a machine tool.

BACKGROUND OF THE INVENTION

Conventional distance or proximity indicators, designed to respond to the relative movement of a part carrying the indicator and an element whose approach is to be detected, generally make use of switching devices having two operating conditions (e.g. open and closed) respectively signaling the fact that such element is or is not within a predetermined range. Systems of this nature relying on physical contact with the approaching element have the disadvantage that they may suffer from material fatigue, mechanical wear or environmental contamination.

There have recently been proposed various contactless arrangements which do not rely upon a physical bridging of the space between the two members. Especially where the distance of a metal part from another part is of interest, use is made of oscillators whose attenuation or damping increases as the metal part approaches. Such circuits may be coupled to switches and may even be inherently threshold-type devices. As is well known, an amplifier with positive feedback having a regenerative coupling factor K and an amplification factor V will oscillate when $KV > 1$, the product KV being known as the loop gain. However, when the damping or attenuation increases the loop gain so that $KV < 1$, oscillation ceases. Thus, the oscillator can be set so that oscillation terminates upon the approach of the metal part to within a predetermined distance from the oscillator, the termination of oscillation being used to operate an indicator, signaling device, counter or other load.

It has been proposed, in connection with contactless switches, to connect the same by only two conductors to a stationary object when, for example, the indicator is to be mounted upon a moving part. Two-wire connections are also desirable in many instances in which the indicator is fixed. In such a case the two conductors must serve, on the one hand, to deliver the supply current for the oscillator associated parts and, on the other hand, to carry an output signal when the metal part has reached the predetermined distance from the indicator. In conventional systems, electronic switches have been provided at the output of the oscillator which, when triggered, cut off the oscillator and render the latter ineffectual. Such switches are, for example, thyristors which, upon conducting, short-circuit the supply to the oscillator. This arrangement has, of course, the disadvantage that the distance sensor is de-energized for the duration of the operation of the switch, complex circuitry is necessary to ensure re-energization of the sensor, and loading of the source is high.

In my prior applications referred to above I have disclosed a contactless electronic proximity sensor whose metal-detecting stage, designed as an oscillator of the type discussed, is maintained continuously energized independently of the state of a switch responsive to changes in the amplitude of the generated oscillations. This is accomplished by the provision of a supply circuit which includes a constant-voltage impedance, specifically a Zener diode, connected in series with a high-ohmic ancillary resistance across a source of pulsating direct current, a bistable electronic switch in the form of a solid-state controlled rectifier (SCR) or thyristor lying in shunt with that resistor so as effectively to short-circuit same upon being rendered conductive by a trigger stage under the control of the oscillation generator. The Zener diode is thus continuously energized, regardless of the state of conductivity of the electronic switch, and delivers the necessary operating voltage to a pair of power-input terminals of the oscillator and of the associated trigger stage.

This arrangement obviates the need for current converters, transformers and the like and also dispenses with the necessity for providing separate circuitry to supply the oscillator. The latter is energized substantially independently of the load resistance and of the supply voltage whereby several such switching circuits can be connected in parallel or in series to a common source.

OBJECTS OF THE INVENTION

An object of my present invention is to provide an improved system of this character with further stabilization of the voltage drop developed thereacross in the two operating stages of the binary switch.

A more specific object is to eliminate voltage peaks which occur upon a switchover in the system of my copending application in which the cathode of the thyristor, connected through a Zener diode to a negative bus bar of the supply circuit, is held at a fixed potential whereas the gate voltage of the thyristor is varied under the control of the trigger stage.

If the Zener diode of the aforedescribed system is shunted by a storage capacitor designed to smooth the operating voltage of the detector unit and the associated trigger stage, the presence of this storage capacitor may lead to an untimely firing of the thyristor upon the initial connection of the proximity sensor to its power supply. Another object of my invention, therefore, is to prevent such untimely firing in a simple and dependable manner.

A further object of this invention is to provide a proximity sensor of this description adapted to be realized, at least to a substantial extent, by monolithically integrated circuitry.

SUMMARY OF THE INVENTION

The basic constituents of a proximity sensor embodying my invention are a detector unit sensitive to the approach of an extraneous element for generating a control signal in an output circuit thereof, this signal varying with the distance of such element from a predetermined location such as the tank circuit of an oscillator forming part of that unit; a voltage-generating network including a constant-voltage impedance, such as the aforementioned Zener diode preferably shunted by a storage capacitor, bridged together with a series resistance across a supply circuit delivering a pulsating direct current, the power-input terminals of the detector stage being connected across this constant-voltage impedance; and a binary electronic switch, such as a thyristor, connected in shunt with all or part of this voltage-generating network, the switch being coupled to a trigger stage which responds to a predetermined change in the control signal to modify the flow of current through the ancillary series resistance of the network while maintaining a sufficient current flow through the constant-voltage impedance thereof to keep the detector unit operative in either state of conductivity of the binary switch whereby a relay or other indicator in the supply circuit responds to changes in this state of conductivity to register a predetermined variation of the control signal representing an approach of the extraneous element to within a specified distance.

In principle, the detector unit need not incorporate such an oscillator but may comprise a variety of other sensing devices, preferably of the contactless type, such as magnetic diodes, charged plates, or photoelectric transducers including diodes, resistors and transistors. In the description which follows, however, reference will be made specifically to an oscillation generator as an instance of such a detector.

According to a more specific feature of my present invention, the cathode of the thyristor used as a binary switch is not maintained at a substantially fixed potential but is connected to the output of the trigger stage, specifically to the collector of a switching transistor controlled by that stage, while the gate of the thyristor is connected to the high-voltage (positive) terminal of the storage capacitor and thus to one of the power-input terminals of the detector stage. With the switching transistor conducting, a condition necessary in that case to enable the firing of the thyristor on every d-c pulsation, the thyristor cathode is maintained at a low potential (with reference to the negative supply terminal or bus bar) so that the thyristor breaks down well before its gate potential has reached the level of the Zener voltage which limits the charge of the storage capacitor. Thus, there are no transient voltage peaks generated which could give rise to annoying static and which may also manifest themselves as possibly detrimental interruptions of the load current. The magnitude of the cathode voltage may be controlled by the insertion of a low-ohmic resistor between the switching transistor and the thyristor, with the series combination of the emitter/collector path of the transistor and the cathode resistor connected directly across the Zener diode which lies in series with the thyristor. With the ancillary series resistance shunting the anode/cathode path of the thyristor, this relatively high-ohmic ancillary resistance forms with the cathode resistor a voltage divider which can be designed to allow firing of the thyristor only with near-zero values of the pulsating supply voltage but to prevent such firing in other parts of a cycle in which the cathode potential approaches the Zener level. This can be advantageous in case it is desired that the load be actuated — if at all — only at specific instants, i.e. substantially at the beginning of each half-cycle of an alternating supply voltage.

According to another feature of my invention, designed to minimize the number of impedance elements which must be traversed by the load current in the conductive condition of the thyristor, the latter is not connected in parallel with the ancillary resistance of the voltage-generating network (as in the system of my prior applications) but, together with another Zener diode inserted between its cathode and the negative bus bar, lies in shunt with that entire network, this second Zener diode being bridged by the switching transistor and the associated cathode resistor. As in the previous case, the cathode resistor should be of such low magnitude as to pass at least the sustaining current of the thyristor when the switching transistor is saturated; thus, the thyristor will conduct even before the Zener diode in series therewith breaks down.

For reasons explained hereinafter, the breakdown level of the second Zener diode (in the cathode lead of the thyristor) should be at least as high as that of the Zener diode shunting the storage capacitor. This requirement, however, may be obviated by resorting to another feature of my present invention according to which not only the cathode but also the gate of the thyristor are variably energized, with relatively opposite polarity, under the control of the trigger stage. Thus, an ancillary energizing circuit for the thyristor gate may extend from the collector of the switching transistor to that gate by way of an inverter stage, this ancillary circuit advantageously including the base/emitter path of an emitter-follower transistor whose presence permits the use of a relatively large gate resistor in parallel with a charging diode for the storage capacitor whereby the current drain of the inverter stage in the nonconductive state of the thyristor is minimized.

BRIEF DESCRIPTION OF THE DRAWING

The above and other features of my invention will now be described in detail with reference to the accompanying drawing in which.

SPECIFIC DESCRIPTION

Figure 1:
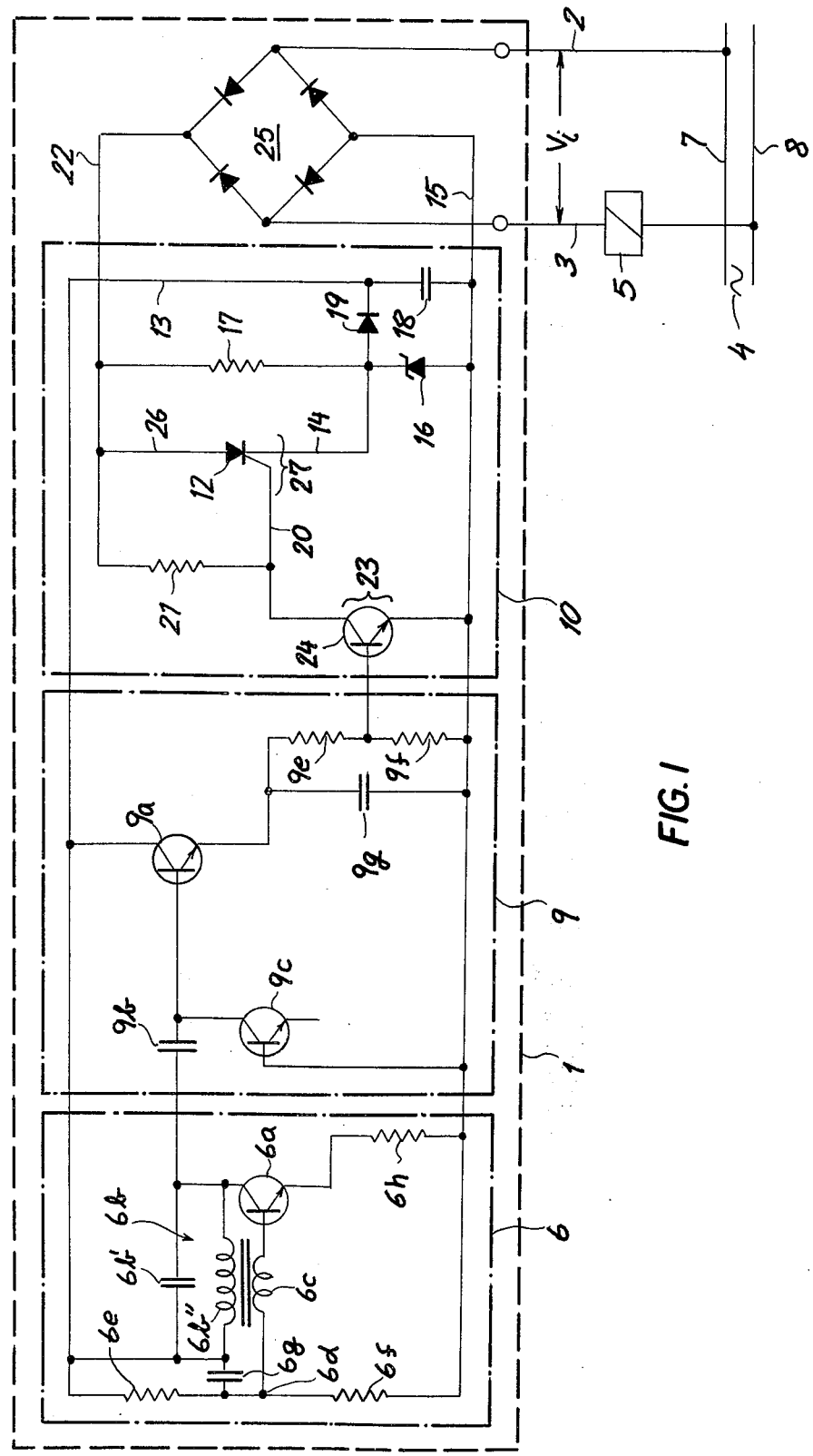
FIG. 1 is an overall circuit diagram of a proximity sensor according to the invention, substantially as disclosed in my prior applications Ser. Nos. 80,016 and 290,866.

In FIG. 1 I have illustrated a sensing circuit 1, responsive to the proximity of a metal part (not shown), which is connected by a two-wire line 2, 3 to an alternating-current source 4 in series with a load 5 in the form of a current-responsive indicator. Member 5 may be a relay whose contacts can be reversed to signal the attainment of a predetermined spacing of an external metallic element from the sensor 1.

The contactless distance sensor 1 comprises an oscillator 6 which may be of the type described in my copending applications Ser. Nos. 290,866, 290,867 and 290,868 all filed 21 Sept. 1972, now U.S. Pat. Nos. 3,747,010, 3,747,011 and 3,747,012 respectively. In the illustrated embodiment, the oscillator 6 comprises an NPN transistor 6a whose collector circuit includes a parallel-resonant network 6b consisting of a capacitor 6b' and an inductor 6b''. A feedback inductor 6c is connected between the base of the transistor 6a and a common terminal 6d of a pair of resistances 6e, 6f forming a voltage-divider network; the two coils 6b'', 6c are inductively coupled as diagrammatically indicated in the drawing. Resistance 6e is bridged by a shunt capacitor 6g. A resistance 6h is connected between the emitter of transistor 6a and a negative bus bar 15 also tied to the resistance 6f. This oscillator generates an output of a frequency determined by the tuned or tank circuit 6b and at a level depending, in a manner known per se, on the damping induced by the proximity of metal parts to the oscillator (specifically to its tank circuit 6b) which lowers the Q of circuit 6b and therefore reduces the effective collector resistance of transistor 6a along with the amplification factor V so as to attenuate the oscillator output.

I also prefer to provide a snap-action or bistable amplification stage 9 triggerable by the output of the oscillator 6 when the loop gain KV of the amplifier 6a thereof makes the transition between values greater and less than unity. The trigger stage 9 comprises a transistor 9a of the NPN type whose base is tied to the collector of transistor 6a by a d.c.-blocking coupling capacitor 9b. The base of transistor 9a is biased positively by a transistor 9c connected as a diode to the negative bus bar 15 of the circuit. The output of transistor 9a, whose amplitude decreases upon the approach of a metallic element as described above, is applied by an emitter impedance, in the form of an R/C network consisting of resistors 9e and 9f bridged by a storage capacitor 9g, to the base of an NPN switching transistor 23 included in a component 10 which serves in part as a voltage-generating network and also includes a binary electronic switch shown as a thyristor 12. The voltage-generating network of this component includes a storage capacitor 18 connected between the negative bus bar 15 and a positive lead 13 supplying the transistors 6a and 9a of the preceding stages; capacitor 18 is shunted by a Zener diode 16 in series with a rectifying diode 19, the latter lying in a charging circuit for the capacitor which includes a high-ohmic ancillary resistor 17 in parallel with the anode/cathode path and associated leads 14 and 26 of thyristor 12. The gate of the thyristor is connected through a lead 20 to the collector of transistor 23 and thence via the collector/emitter resistance 23 thereof to negative bus bar 15. The collector of transistor 23 is further connected through a gate resistor 21, which in this instance is also of the high-ohmic type, to a positive bus bar 22 directly tied to the anode lead 26 of thyristor 12; the voltage-generating network consisting of ancillary resistor 17 and the constant-voltage impedance 16, 18, 19 is bridged across the two bus bars 13 and 15. These bus bars, in turn, are energized with pulsating direct current from a rectifier bridge 25 connected across the wires 2, 3 downstream of load 5. The alternating voltage developed across the input diagonal of bridge 25 has been indicated at $V_i$.

Figure 5:
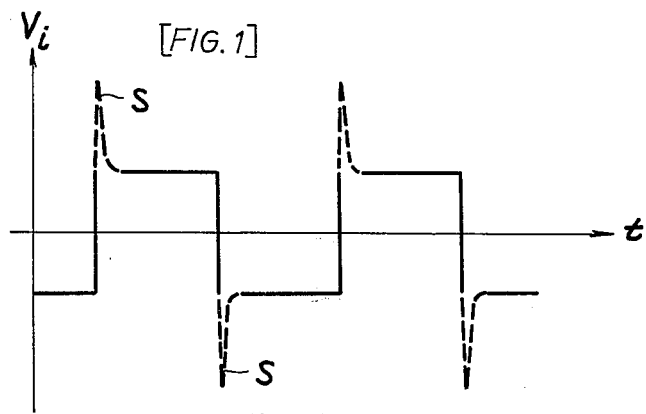
FIG. 5 is a graph showing an input voltage developed across the proximity sensor of FIG. 1.

Switching transistor 23 conducts as long as a sufficiently positive charge is accumulated on capacitor 9g, i.e. as long as transistor 9a of trigger stage 9 is turned on by a biasing potential on its base corresponding to a relatively high amplitude of the oscillations generated by transistor 6a in detector unit 6. Upon a substantial reduction in the amplitude level, trigger transistor 9a and switching transistor 23 are cut off whereby the positive-going potential of lead 20 energizes the gate of thyristor 12 sufficiently to drive a firing current throut the gate/cathode path 27 of the thyristor with resulting short-circuiting of the high-ohmic ancillary resistor 17. That operation sharply lowers the potential of bus bar 22 from the value it had attained just prior to the firing of the thyristor; this has been illustrated in FIG. 5 where the square wave $V_i$ represents the a-c counterpart of the raw-rectified pulsating voltage developed beyond bridge 25 across bus bars 15 and 22. It will be seen that each zero crossing of this input voltage $V_i$ is followed by a sharp spike S which appears as a positive pulse on bus bar 22 and is required to overcome the gate/cathode resistance 27 of the thyristor before the latter can conduct to reduce the input voltage to a predetermined amplitude whose absolute value is only slightly higher than the breakdown level of Zener diode 16. (It will be understood that the flanks of the square-wave pulses are not perfectly vertical, as diagrammatically illustrated, so that the pulsations through thyristor 12 are separated by brief periods of nonconductivity.)

Independently of the state of conductivity of thyristor 12, Zener diode 16 is traversed by a current drawn either through resistor 17 or through the parallel combination of that resistor and the main current path of the thyristor. Capacitor 18 thus remains charged, via diode 19, to substantially the Zener level to keep the power-input lead 13 of oscillator 6 and trigger 9 energized. Detector unit 6 is therefore continuously maintained operative, even if the oscillations cease completely, through the steady energization of lead 13.

At the beginning of operations, i.e. before power supply 4, 25 is connected to the bus bars 15 and 22 of proximity sensor 1, capacitor 18 is of course discharged so that the cathode lead 14 of thyristor 12 is at nearly the potential of negative bus bar 15 when the circuit is closed. It may therefore happen that the gate lead 20 is initially driven more positive than the cathode lead 14 to such an extent that, regardless of the absence of a metallic element whose proximity is to be detected, the thyristor fires and actuates the relay 5. This drawback can be avoided by connecting a large capacitor across the main path 23 of transistor 24 to hold down the initial gate voltage, yet a simpler and more dependable solution is provided by the improved components 10a, 10b and 10c shown in FIGS. 2 – 4 which also eliminate the spikes S of FIG. 5.

Figure 2:
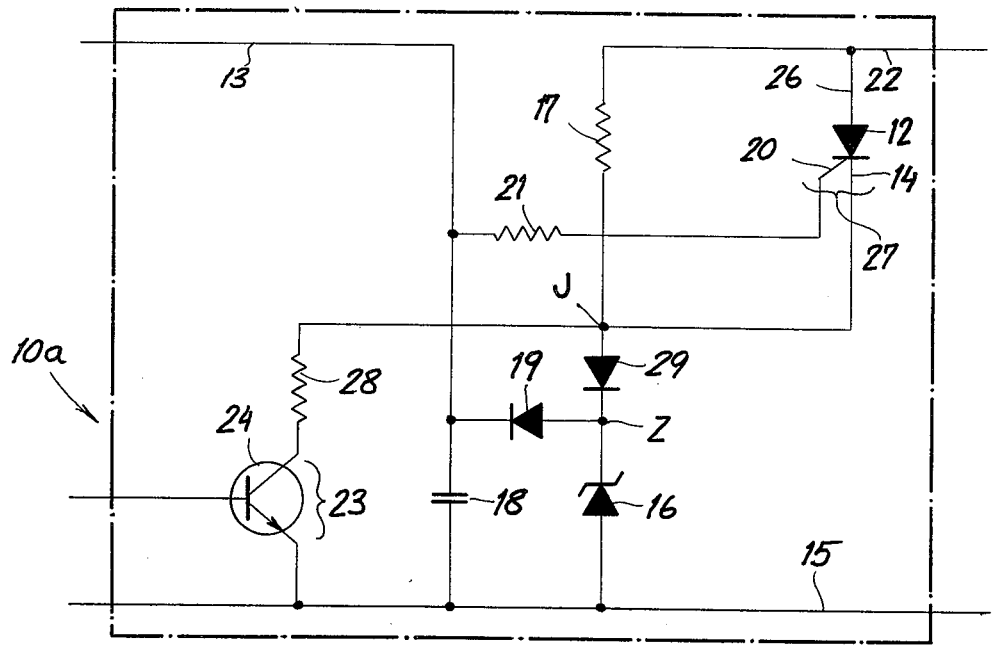
FIGS. 2, 3 and 4 are fragmentary circuit diagrams showing several modifications of a component of the system of FIG. 1.
Figure 3:
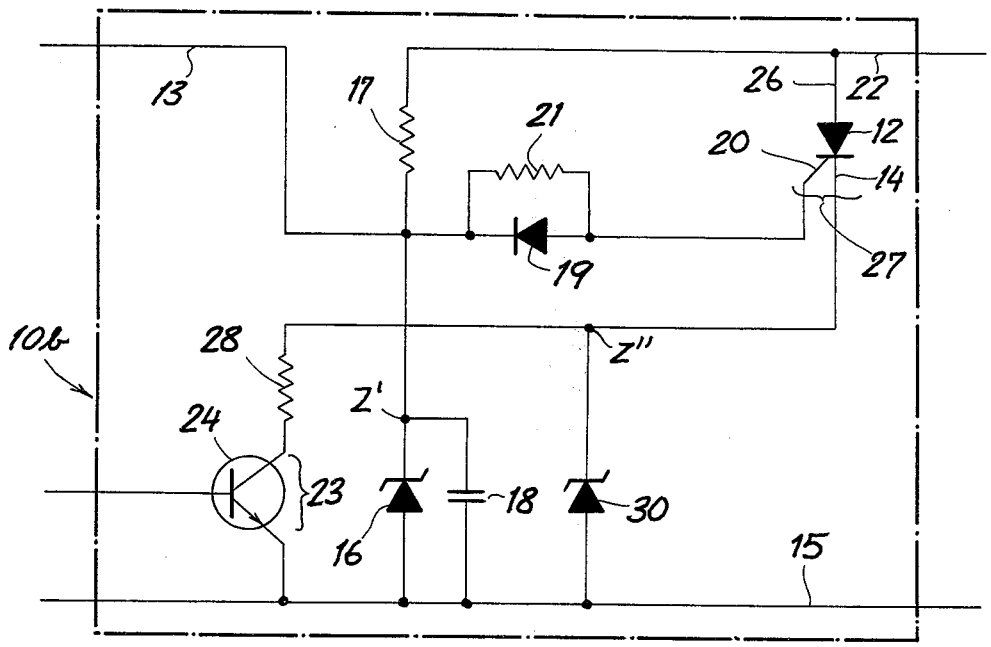
Figure 4:
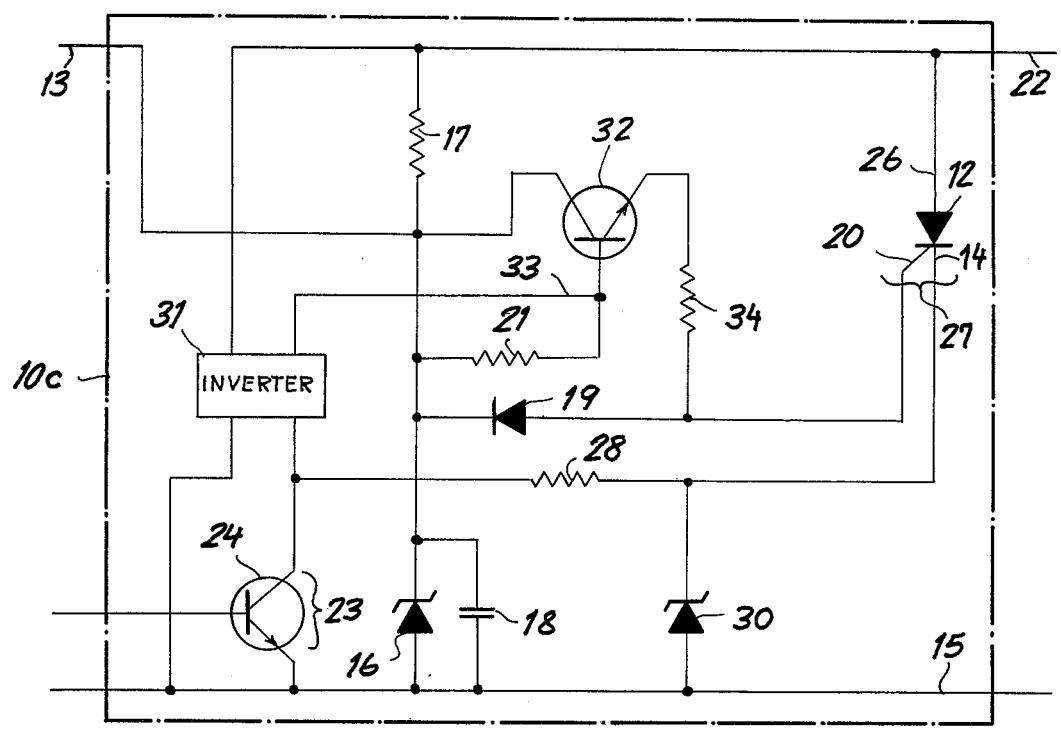

In FIGS. 2 – 4 I have employed, as far as applicable, the same numerals as in FIG. 1 to designate analogous elements. It is to be understood, however, that in the modifications of these Figures the switching transistor 24 must saturate (or at least conduct) when the thyristor 12 is to be fired, i.e. when the load 5 is to be energized, whereas the transistor is cut off in the alternate condition in which the input resistance of sensing circuit 1 is to be high. Thus, contrary to the arrangement of FIG. 1, these modified systems will indicate the approach of a metallic element by the release of relay 5 unless trigger stage 9 is altered (e.g. by the introduction of an inverter) to drive the base of transistor 24 negative when the oscillation amplitudes in the output of detector 6 are high.

In FIG. 2 the cathode lead 14 of thyristor 12, forming part of the component 10a replacing the component 10 of FIG. 1, is connected to a junction J representing a point on a voltage divider constituted by the ancillary resistor 17 and a relatively low-ohmic cathode resistor 28, this voltage divider being bridged across bus bars 15 and 22 in series with transistor 24 whose collector is joined to its resistor 28. Gate lead 20 is connected through another high-ohmic resistor 21 to the power-input lead 13 for components 6 and 9 (FIG. 1) originating, as before, at a common terminal of capacitor 18 and its charging diode 19. The common terminal of this charging diode with Zener diode 16 is connected to junction point J through a further rectifying diode 29 in cascade with diode 19, the cascaded diodes being so poled as to oppose the flow of discharge current from capacitor 18 to junction J.

In the operation of the system of FIG. 2, thyristor 12 remains nonconductive as long as transistor 24 is cut off. Junction J, and therefore the cathode lead 14, is then maintained at a positive potential which exceeds the Zener potential, present at the point Z to which the three diodes 16, 19 and 29 are joined, by the small voltage drop developed across the forward resistance of diode 29; gate lead 20, on the other hand, is essentially at the charging potential of capacitor 18 which falls short of the Zener level by the voltage drop across the forward resistance of diode 19. Under these conditions, therefore, thyristor 12 acts as an open switch and the input resistance of circuit 1 remains high so that voltage $V_i$ varies sinusoidally with that of source 4 and the current flow through relay 50 is insufficient to actuate same.

Figure 6:
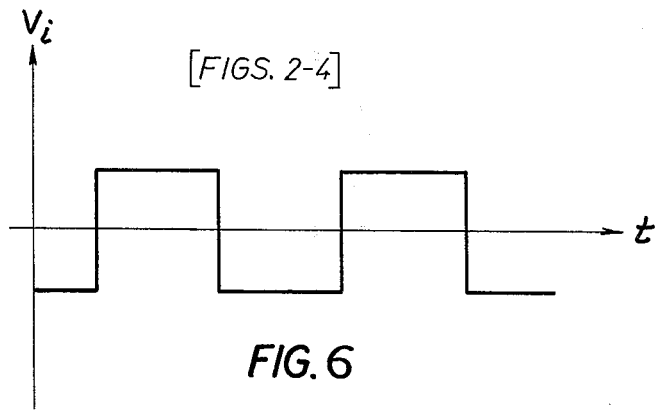
FIG. 6 is a graph similar to FIG. 5 but relating to a modified system according to FIGS. 2, 3 or 4.

As soon as transistor 24 saturates, the cathode voltage of thyristor 12 drops to a low level only slightly above that of bus bar 15. Since the gate voltage of the thyristor is not affected by the conduction of transistor 24, gate current now flows through the path 27 so that the thyristor fires and draws current through its anode 26 from bus bar 22. The firing point occurs early in each half-cycle, as soon as bus bar 22 has gone sufficiently positive to sustain conduction. The potential of this bus bar therefore never rises above that established by the Zener potential and the voltage drops across diode 29 and thyristor 12 so that voltage $V_i$ is a square wave as illustrated in FIG. 6, lacking the spikes of FIG. 5.

It will also be noted that upon the initial connection of component 10a to its power supply, i.e. with capacitor 18 discharged, gate lead 20 is at low voltage so that thyristor 12 will not fire, as it might in the system of FIG. 1 with transistor 24 cut off. Also, whereas in that system the gate resistor 21 is connected in series with switching transistor 23 between bus bars 15 and 22 so as to have virtually the entire supply voltage (e.g. of 220 V) developed thereacross, this resistor is traversed in FIG. 2 by only a small current flow and is therefore readily realizable by monolithically integrated circuitry.

If the series diode 29 were omitted, the system would function in essentially the same manner but only over a restricted range of supply voltages as compared with that of FIG. 1. With a low-voltage source the reverse flow through diode 19 alone could drain the capacitor 18 sufficiently to prevent an adequate energization of the components fed via lead 13. By the provision of diode 29, in a system designed for a supply voltage of 220 V, the same can be made operative over a range down to about 40 V, similar to that realizable with the system of FIG. 1.

The system of FIG. 2 has a minor drawback in that the load current passing through thyristor 12 and Zener diode 16 must also traverse the diode 29, with added energy dissipation and the need for carrying off the developing heat. The presence of this diode also militates against a realization of component 10a by monolithically integrated circuitry.

In FIG. 3 I have shown a further modified component 10b in which the Zener diode 16 is connected directly across the storage capacitor 18 and to the conductor 13, with diode 19 relocated into the connection between this conductor and the gate lead 20 of thyristor 12; diode 19 is shunted by the gate resistor 21. A second Zener diode 30 lies directly in series with the cathode lead 14 of thyristor 12 and in parallel with the combination of switching transistor 24 and low-ohmic resistor 28, the latter being again connected to the collector of this transistor. In this embodiment the gate voltage of the thyristor exceeds by only the forward drop of diode 19 the voltage of conductor 13 substantially corresponding to the Zener potential at the junction Z' of elements 16, 17, 18, 19 and 21; the cathode voltage, on the other hand, equals the Zener potential of diode 30 as developed at the junction Z'' of that diode with cathode resistor 28. Thus, in order to prevent any untimely firing of the thyristor 12 with switching transistor 24 cut off, the Zener potential at Z'' must be at least equal to that at Z'. Upon the saturation of transistor 24, a gate current limited by resistor 21 flows through the path 27 with resulting closure of the electronic switch represented by the thyristor.

In FIG. 4 I have shown still another modified component 10c in which the relationship of the Zener levels of diodes 16 and 30 is made noncritical by the provision of an inverter stage 31 connected across transistor 24, the inverter being energized from bus bar 22 and having an output lead 33 forming part of an ancillary energizing circuit from the gate of thyristor 12. This ancillary circuit includes an emitter-follower NPN transistor 32 with a collector tied to lead 13, a base joined to lead 33 (and returned to the collector via gate resistor 21) and an emitter connected by way of a low-ohmic resistor 34 to gate lead 20. The system is otherwise identical with that of FIG. 3.

As long as switching transistor 24 is cut off, output lead 33 of inverter 31 carries a low voltage close to that of bus bar 15 which also holds down the gate voltage of the thyristor 12, the latter being thus prevented from firing. If, however, transistor 24 becomes conductive, inverter 31 virtually insulates the lead 33 from bus bar 15 so that the more positive potential of lead 13 is now applied to the base of transistor 32 while the voltage on cathode lead 14 is sharply reduced. The firing current through the gate/cathode path 27 of the thyristor is drawn through transistor 32 and resistor 34 without loading the resistor 21 which can therefore have a relatively high value. In this way, the current flow via resistors 17 and 21 over lead 33 into inverter 31 during cut-off of transistor 24 is minimized.

I shall now give, by way of example, representative values for the principal impedance elements of a system according to my invention designed for a supply voltage of 220 V:

| | |
|---|---:|
| ancillary resistor 17 | 150 kΩ |
| gate resistor 21 in FIG. 1 | 220 kΩ |
| gate resistor 21 in FIGS. 2 and 3 | 5.6 kΩ |
| gate resistor 21 in FIG. 4 | 68 kΩ |
| cathode resistor | 1 kΩ |
| storage capacitor 18 | 4.7 μF |
| Zener potential of diode 16 in FIGS. 1 and 2 | 5.6 V |
| Zener potential of diode 16 in FIGS. 3 and 4 | 4.7 V |
| Zener potential of diode 30 in FIG. 3 | 5.6 V |
| Zener potential of diode 30 in FIG. 4 | 4.7 V |

It is to be understood that compatible features of different embodiments may be combined with one another; thus, for example, the inverter 31 of FIG. 4 (with or without its emitter-follower transistor 32)

could also be used in an ancillary energizing circuit for the gate of thyristor 12 in the system of FIG. 2.

I claim:

1. A proximity sensor comprising:

detector means sensitive to the approach of an extraneous element for generating in an ouput circuit a control signal varying with the distance of such element from a predetermined location, said detector means being provided with a pair of power-input terminals;

a voltage-generating network including a constant-voltage impedance and an ancillary resistance in series therewith, said terminals being connected across said constant-voltage impedance;

a supply circuit including a source of direct current connected across said network;

binary electronic switch means connected in shunt with at least part of said network across said source;

trigger means coupled to said output circuit and connected to said switch means for reversing the state of conductivity thereof in response to a predetermined change in said control signal, thereby modifying the flow of current through said ancillary resistance with maintenance of a sufficient current flow through said constant-voltage impedance to keep said detector means operative in either state of conductivity of said switch means; and indicator means in said supply circuit responsive to changes in the state of conductivity of said switch means to register a predetermined variation of said control signal representing an approach of said element within a specified distance.

2. A proximity sensor as defined in claim 1 wherein said switch means comprises a thyristor provided with a cathode, a gate and an anode, said source being a generator of pulsating current provided with a positive lead connected to said anode and with a negative lead connected to one of said terminals, said trigger means being connected across said gate and cathode.

3. A proximity sensor as defined in claim 2 wherein said trigger means comprises a switching transistor connected between said negative lead and said cathode, said gate being connected to the other of said terminals.

4. A proximity sensor as defined in claim 3 wherein said constant-voltage impedance comprises a Zener diode in parallel with a capacitance.

5. A proximity sensor as defined in claim 4, further comprising a charging diode inserted between said ancillary resistance and said capacitance, said other of said terminals being connected directly to said capacitance and through the reverse resistance of said charging diode to said Zener diode.

6. A proximity sensor as defined in claim 5 wherein said ancillary resistance is connected between said cathode and said anode.

7. A proximity sensor as defined in claim 6, further comprising a rectifying diode inserted between said ancillary resistance and said charging diode in cascade with the latter, said Zener diode being connected to a common terminal of the cascaded diodes.

8. A proximity sensor as defined in claim 4, further comprising an inverter stage connected to said switching transistor and an ancillary energizing circuit for said gate connected to said inverter stage for applying to said gate a potential varying inversely with the potential applied to said cathode by said switching transistor.

9. A proximity sensor as defined in claim 8 wherein said ancillary energizing circuit includes an emitter-follower transistor.

10. A proximity sensor as defined in claim 4 wherein said switch means further comprises a second Zener diode connected in series with said thyristor between said cathode and said negative lead.

11. A proximity sensor as defined in claim 10 wherein the connection between said gate and said other of said terminals includes a rectifying diode shunted by a resistor.

12. A proximity sensor as defined in claim 11 wherein said connection further includes a base/emitter path of an emitter-follower transistor coupled to said switching transistor through an inverter stage for applying to said gate a potential varying inversely with the potential applied to said cathode by said switching transistor.

13. A proximity sensor as defined in claim 3 wherein said switching transistor has an output electrode connected to said thyristor through a cathode resistor of substantially lower magnitude than said ancillary resistance, further comprising a Zener diode bridging the series combination of said transistor and said cathode resistor.

14. A proximity sensor as defined in claim 13 wherein said ancillary resistance is connected in parallel with said thyristor between said positive lead and said Zener diode.

15. A proximity sensor as defined in claim 13 wherein said constant-voltage impedance is connected between said negative lead and said gate.

16. A proximity sensor as defined in claim 15, further comprising a gate resistor inserted between said gate and the junction of said ancillary resistance with said constant-voltage impedance.

17. A proximity sensor as defined in claim 16, further comprising a shunt diode for said gate resistor inserted between said gate and said junction with a polarity opposing the flow of gate current to said junction.

18. A proximity sensor as defined in claim 1 wherein said detector means comprises an oscillation generator.

* * * * *